(12) United States Patent
Doyen et al.

(10) Patent No.: US 12,088,841 B2
(45) Date of Patent: Sep. 10, 2024

(54) PREDICTION FOR LIGHT-FIELD CODING AND DECODING

(71) Applicant: InterDigital VC Holdings, Inc., Wilmington, DE (US)

(72) Inventors: Didier Doyen, Cesson-Sévigné (FR); Olivier Bureller, Chateaugiron (FR); Guillaume Boisson, Pleumeleuc (FR)

(73) Assignee: InterDigital VC Holdings, Inc., Wilmington, DE (US)

( * ) Notice: Subject to any disclaimer, the term of this patent is extended or adjusted under 35 U.S.C. 154(b) by 0 days.

(21) Appl. No.: 18/103,115

(22) Filed: Jan. 30, 2023

(65) Prior Publication Data

US 2023/0179799 A1    Jun. 8, 2023

Related U.S. Application Data

(63) Continuation of application No. 15/734,455, filed as application No. PCT/US2019/034308 on May 29, 2019, now Pat. No. 11,570,471.

(30) Foreign Application Priority Data

Jun. 5, 2018    (EP) .................................... 18305684

(51) Int. Cl.
*H04N 19/597*    (2014.01)
*H04N 19/105*    (2014.01)
*H04N 19/182*    (2014.01)

(52) U.S. Cl.
CPC ......... *H04N 19/597* (2014.11); *H04N 19/105* (2014.11); *H04N 19/182* (2014.11)

(58) Field of Classification Search
CPC ............................ H04N 19/597; H04N 19/105
See application file for complete search history.

(56) References Cited

U.S. PATENT DOCUMENTS 10,638,158 B2 * 4/2020 Boisson ............... H04N 19/593
10,887,576 B2 * 1/2021 Drazic ................. H04N 23/957
(Continued)

FOREIGN PATENT DOCUMENTS

CN    105657221 A    6/2016
CN    107076985 A    8/2017
(Continued)

OTHER PUBLICATIONS

Bierasinski, Rachel L., "Calibration of a Plenoptic Camera for Use in Three-Dimensional Particle Tracking", Master of Science Thesis, University of Rochester, Department of Mechanical Engineering, 2014, pp. 1-79.
(Continued)

*Primary Examiner* — Irfan Habib
(74) *Attorney, Agent, or Firm* — CONDO ROCCIA KOPTIW LLP

(57) ABSTRACT

Predicting a component of a current pixel belonging to a current sub-aperture image in a matrix of sub-aperture images captured by a sensor of a type I plenoptic camera can involve, first, determining a location on the sensor based on: a distance from an exit pupil of a main lens of the camera to a micro-lens array of the camera; a focal length of the main lens; a focal length of the micro-lenses of the micro-lens array; and a set of parameters of a model of the camera allowing for a derivation of a two-plane parameterization describing the field of rays corresponding to the pixels of the sensor; and, second, predicting the component based on one reference pixel belonging to a reference sub-aperture image in the matrix and located on the sensor in a neighborhood of the location.

17 Claims, 5 Drawing Sheets

(56) References Cited

U.S. PATENT DOCUMENTS

| | | | |
|---|---|---|---|
| 11,092,820 B2* | 8/2021 | Blonde | ............... H04N 13/106 |
| 2014/0307795 A1 | 10/2014 | Chen et al. | |
| 2015/0319456 A1 | 11/2015 | Le Floch | |
| 2016/0073132 A1 | 3/2016 | Zhang et al. | |
| 2017/0034529 A1 | 2/2017 | Lin et al. | |
| 2017/0221223 A1 | 8/2017 | Hu et al. | |
| 2018/0262776 A1* | 9/2018 | Seifi | ........................ G06T 7/557 |
| 2018/0316935 A1* | 11/2018 | Boisson | ............... H04N 19/176 |
| 2019/0158877 A1* | 5/2019 | Thoreau | ................. H04N 19/15 |
| 2019/0295232 A1* | 9/2019 | Blonde | ................... G06T 19/20 |

FOREIGN PATENT DOCUMENTS

| | | |
|---|---|---|
| EP | 2879372 A1 | 6/2015 |
| EP | 3 026 887 A1 | 6/2016 |
| EP | 3026628 A1 | 6/2016 |
| EP | 3 065 395 A1 | 9/2016 |
| EP | 3160142 A1 | 4/2017 |
| EP | 3188123 A1 | 7/2017 |
| WO | 2013/159330 A1 | 10/2013 |
| WO | 2016024158 A2 | 2/2016 |
| WO | 2017/114904 A1 | 7/2017 |

OTHER PUBLICATIONS

Bouguet, J-Y, "Camera Calibration Toolbox for Matlab", Available at <http://www.vision.caltech.edu/bouguetj/calib_doc/>, Oct. 14, 2015, 4 pages.

Hahne et al., "Baseline and Triangulation Geometry in a Standard Plenoptic Camera", International Journal of Computer Vision, vol. 126, No. 2, Aug. 20, 2017, pp. 21-35.

Jorissen et al., "A Qualitative Comparison of MPEG View Synthesis and Light Field Rendering", 2014 3DTV-Conference: The True Vision—Capture, Transmission and Display of 30 Video (3DTV-CON), Budapest, Hungary, Jul. 2, 2014, 4 pages.

Kalantari et al., "Learning-Based View Synthesis for Light Field Cameras", ACM Transactions on Graphics, vol. 35, No. 6, Article No. 193, Nov. 2016, 10 pages.

Lee et al., "A Framework of 30 Video Coding using View Synthesis Prediction", 2012 Picture Coding Symposium (PCS), Krakow, Poland, May 7-9, 2012, 4 pages.

Shimizu et al., "Backward View Synthesis Prediction using Virtual Depth Map for Multiview Video Plus Depth Map Coding", 2013 Visual Communications and Image Processing (VCIP), Kuching, Malaysia, Nov. 17, 2013, 6 pages.

Sullivan et al., "Standardized Extensions of High Efficiency Video Coding (HEVC)", IEEE Journal of Selected Topics in Signal Processing, vol. 7, No. 6, Dec. 2013, pp. 1001-1016.

Tian et al., "Backward View Synthesis Prediction for 30-HEVC", 2013 IEEE International Conference an Image Processing, Melbourne, Australia, Sep. 15, 2013, pp. 1729-1733.

Yea et al., "View Synthesis Prediction fur Multiview Video Coding", Signal Processing: Image Communication, vol. 24, No. 1-2, Jan. 2009, pp. 89-100.

Zhang, Zhengyou, "A Flexible New Technique for Camera Calibration", Microsoft Corporation Technical Report, MSR-TR-98-71, Dec. 2, 1998, pp. 1-22.

* cited by examiner

PREDICTION FOR LIGHT-FIELD CODING AND DECODING

CROSS REFERENCE TO RELATED APPLICATIONS

This application is a continuation application of U.S. Non-Provisional application Ser. No. 15/734,455, filed Dec. 2, 2020, which claims the benefit, under 35 U.S.C. § 371 of Patent Cooperation Treaty Application No. PCT/US2019/034308, filed May 29, 2019, which claims the benefit of European Patent Application No. 18305684.5 filed Jun. 5, 2018.

FIELD OF THE DISCLOSURE

The present disclosure relates generally to the field of Light Field (LF) video coding.

More specifically, the disclosure relates to a method for predicting a component of a pixel belonging to a sub-aperture image captured by a type I plenoptic camera.

The disclosure can be of interest for instance in the field of LF compression and/or decompression.

TECHNOLOGICAL BACKGROUND

On one hand, View Synthesis Prediction (VSP) has been standardized as part of the 3D-HEVC extension for multi-view video coding. More particularly, VSP consists in using depth information to warp texture data from a reference view to a current view such that a predictor for the current view can be generated (see e.g.: "S. Yea and A. Vetro, "*View Synthesis Prediction for Multiview video coding*", in Signal Processing: Image Communication, vol. 24, no 1-2, pp. 89-100, January 2009).

On the other hand, LF data consist either in:
- multi-view video, i.e. in a video in which the images belonging to a matrix of images have been captured simultaneously from multiple camera angles; or
- plenoptic video, also known as lenslet based video, i.e. in a video in which the images belonging to a matrix of images are sub-aperture images that have been captured simultaneously from a single camera using a matrix of lenses in addition to the main lenses system.

VSP assumes among other a pinhole model for the camera that has been used to capture the LF video. This prevents from achieving high performances in LF video coding, in particular for LF captured by plenoptic camera for which the extend of the aperture cannot be neglected.

There is thus a need for an improved method for predicting a component (e.g. a chrominance or luminance) of a pixel of a sub-aperture image in a LF captured by a plenoptic camera.

SUMMARY

The present disclosure relates to a method for predicting a component of a current pixel belonging to a current sub-aperture image in a matrix of sub-aperture images captured by a sensor of a type I plenoptic camera. Such method comprises:
  determining a location on the sensor based at least on:
    a distance D from an exit pupil of a main lens of the camera to a micro-lens array of the camera;
    a focal length F of the main lens;
    a focal length f of the micro-lenses of the micro-lens array; and
    a set of parameters of a model of the camera allowing for a derivation of a two-plane parameterization describing the field of rays corresponding to the pixels of the sensor;
  predicting the component of the current pixel based on at least one reference pixel belonging to a reference sub-aperture image in the matrix and located on the sensor in a neighborhood of the location.

Another aspect of the disclosure pertains to a device for predicting a component of a current pixel belonging to a current sub-aperture image in a matrix of sub-aperture images captured by a sensor of a type I plenoptic camera. Such device comprises a processor configured for:
  determining a location on the sensor based at least on:
    a distance D from an exit pupil of a main lens (100$l$) of the camera to a micro-lens array (100$mla$) of the camera;
    a focal length F of the main lens;
    a focal length f of the micro-lenses of the micro-lens array; and
    a set of parameters of a model of the camera allowing for a derivation of a two-plane parameterization describing the field of rays corresponding to the pixels of the sensor;
  predicting the component of the current pixel based on at least one reference pixel belonging to a reference sub-aperture image in the matrix and located on the sensor in a neighborhood of the location.

Another aspect of the disclosure pertains to a bitstream carrying a light field captured by a sensor of a type I plenoptic camera. Such bitstream comprises metadata comprising:
  a distance D from an exit pupil of a main lens of the camera to a micro-lens array of the camera;
  a focal length F of the main lens;
  a focal length f of the micro-lenses of the micro-lens array; and
  a set of parameters of a model of the camera allowing for a derivation of a two-plane parameterization describing the field of rays corresponding to the pixels of the sensor.

In addition, the present disclosure concerns a non-transitory computer readable medium comprising a computer program product recorded thereon and capable of being run by a processor, including program code instructions comprising program code instructions for implementing a method for predicting a component of a current pixel belonging to a current sub-aperture image in a matrix of sub-aperture images captured by a sensor of a type I plenoptic camera previously described.

LIST OF FIGURES

FIG. 1 illustrates an encoder and a decoder respectively encoding and decoding a current pixel of a sub-aperture image captured by a type I plenoptic camera according to at least one embodiment;

FIGS. 2*a* and 2*b* illustrate the relationship between the micro-images captured by the sensor of the camera of FIG. 1 and the corresponding sub-aperture images;

FIGS. 3*a* and 3*b* illustrate an optical property of the type I plenoptic camera of FIG. 1;

FIG. 4 illustrates a flowchart of a method for predicting a component of a current pixel as implemented in the encoder and decoder of FIG. 1 according to at least one embodiment;

FIG. 5*a* illustrates first and second rays as involved in the method of FIG. 4;

DETAILED DESCRIPTION

In all of the figures, the same numerical reference signs designate similar elements and steps.

A method for predicting a component (e.g. a chrominance or luminance) of a current pixel belonging to a current sub-aperture image in a matrix of sub-aperture images captured by a sensor of a type I plenoptic camera is disclosed. Such method comprises a step of determining a location on the sensor based on parameters of the camera. Based on such determined location, the component of the current pixel is predicted based at least on one reference pixel belonging to a reference sub-aperture image in the matrix and located on the sensor in a neighborhood of the determined location.

The prediction relying only on parameters of the camera, the derivations can be performed e.g. on both the encoding side and the decoding side based on a small number of parameters to be shared in between the devices.

Figure 1:
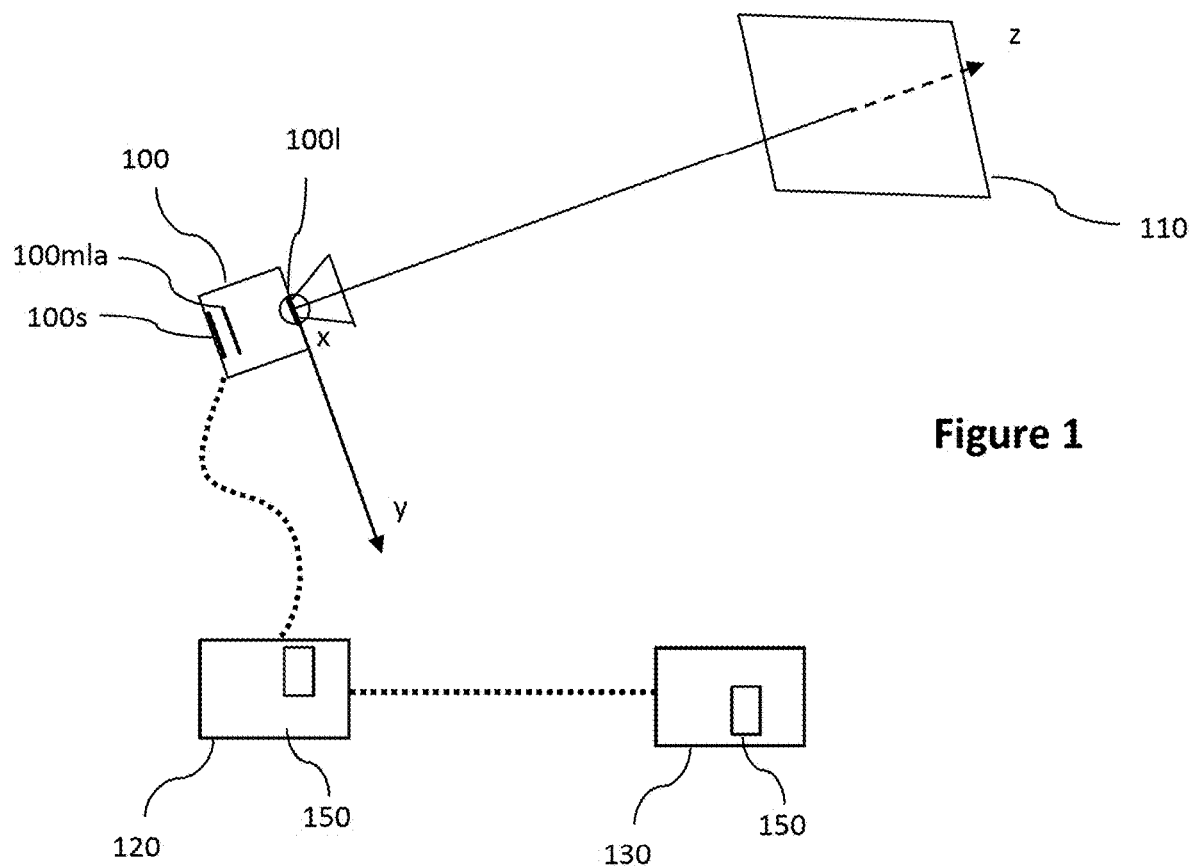

FIG. 1 depicts an encoder 120 and a decoder 130 respectively encoding and decoding a current pixel of a sub-aperture image of an object 110 captured by a type I plenoptic camera 100 according to at least one embodiment.

As illustrated in FIG. 1, the type I plenoptic camera 100 comprises a main lens 100l, a micro-lens array 100mla and a sensor 100s. A type I plenoptic camera (also named plenoptic camera 1.0) is a plenoptic camera in which the distance d from the micro-lens array (100 mla) to the sensor (100s) is equal to a focal length of the micro-lenses f, i.e. f=d, as further illustrated on FIGS. 3a, 3b and 5a.

Three axes define the coordinate system (CS) of the camera. More particularly, when the camera 100 is pointed toward the object 110 that is being captured:

the z axe of the CS is defined as originating from the entry pupil (i.e. the optical image of the aperture stop as seen from the front of the camera) of the camera with z positive in the scene;

the x axe of the CS is defined as originating from the entry pupil of the camera, extending horizontally and pointing toward the right; and the y axe of the CS is defined as originating from the entry pupil of the camera, extending vertically and pointing toward the bottom.

According to these definitions, the entry pupil is located in the plane defined by z=0 in the CS.

Figure 2A:
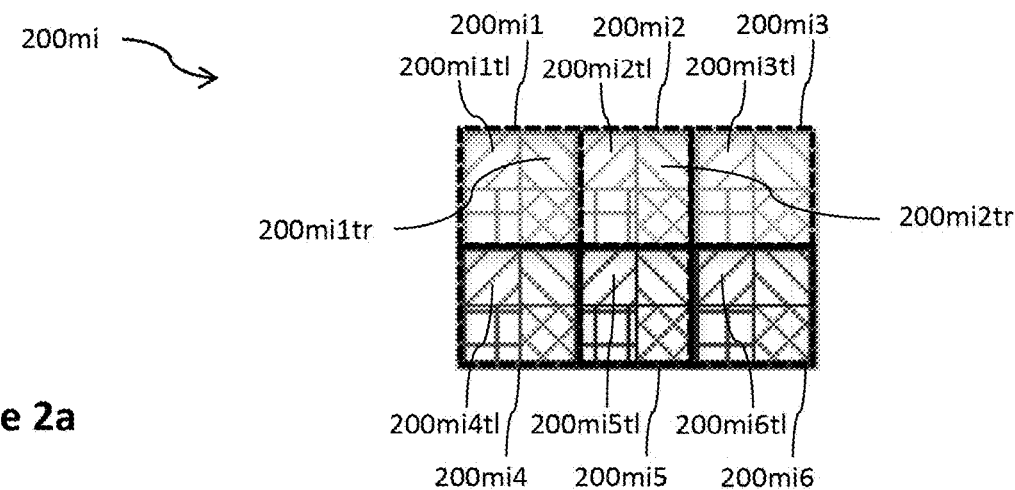
Figure 2B:
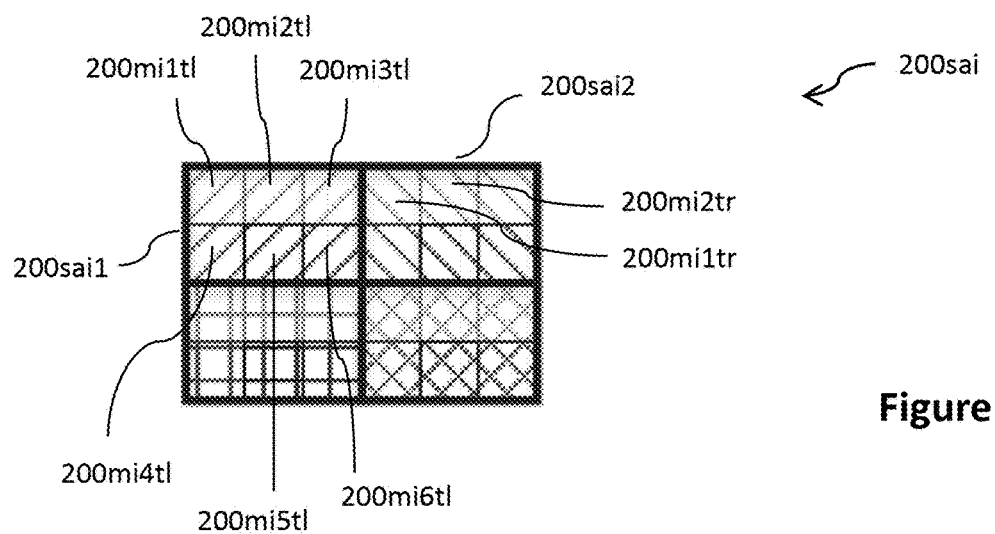

When capturing the object 110 at a given instant, the type I plenoptic camera 100 delivers a matrix 200sai (FIG. 2b) of sub-aperture images belonging to a LF. In the embodiment illustrated in FIG. 2b, the matrix 200sai of sub-aperture images comprises four sub-aperture images comprising six pixels each.

Each sub-aperture image is composed of pixels belonging to all the micro-images of the matrix 200mi (FIG. 2a) of micro-images captured by the sensor 100s, one micro-image being located in front of a corresponding micro-lens of the array 100mla of micro-lenses. More particularly:

the top left pixel of sub-aperture image 200sai1 corresponds to the top left pixel 200mi1tl of the micro-image 200mi1;

the top center pixel of sub-aperture image 200sai1 corresponds to the top left pixel 200mi2tl of the micro-image 200mi2;

the top right pixel of sub-aperture image 200sai1 corresponds to the top left pixel 200mi3tl of the micro-image 200mi3;

the bottom left pixel of sub-aperture image 200sai1 corresponds to the top left pixel 200mi4tl of the micro-image 200mi4;

the bottom center pixel of sub-aperture image 200sai1 corresponds to the top left pixel 200mi5tl of the micro-image 200mi5; and the bottom right pixel of sub-aperture image 200sai1 corresponds to the top left pixel 200mi6tl of the micro-image 200mi6.

The same holds for the other sub-aperture images of the matrix 200sai. For instance:

the top left pixel of sub-aperture image 200sai2 corresponds to the top right pixel 200mi1tr of the micro-image 200mi1;

the top center pixel of sub-aperture image 200sai2 corresponds to the top right pixel 200mi2tr of the micro-image 200mi2;

etc.

There is thus a same number of pixels per micro-image, i.e. four pixels per micro-image in the present embodiment, for being able to reconstruct the four sub-aperture images of six pixels each of the matrix 200sai.

The matrix 200sai of sub-aperture images is delivered to an encoder 120. The encoder comprises a device 150 that is configured for predicting a component of a current pixel according to the method illustrated on FIG. 4.

A prediction residue can be derived between the prediction and the effective value of a component of a pixel of a given sub-aperture image belonging to the matrix 200sai, the prediction being based on a reference sub-aperture image also belonging to the matrix 200sai. The prediction residue can then be encoded in a bitstream.

The encoding of the successive matrices of sub-aperture images captured by the camera 100 delivers a bitstream carrying the LF captured by the type I plenoptic camera 100. Such bitstream can be transferred to the decoder 130 that also comprises a same device 150 as the encoder 120.

The decoder 130 can predict a value of a component of a pixel of a given sub-aperture image belonging to the matrix 200sai based at least on a reference sub-aperture image belonging to the matrix 200sai and on parameters of the type I plenoptic camera 100 used to capture the LF.

The parameters of the type I plenoptic camera 100 are supposed to be known by the decoder 130, more particularly by the device 150. For instance, the bitstream carrying the LF captured by the sensor 100s of the type I plenoptic camera 100 and transmitted by the encoder 120 to the decoder 130 comprise metadata with said parameters. As discussed below in relation with FIG. 4, in at least one embodiment such parameters comprise a distance D from the exit pupil of the main lens 100l to the micro-lens array 100mla, the focal length F of the main lens 100l, a focal length f of the micro-lenses of the micro-lens array 100mla, and a set of parameters of a model of the camera (e.g. pattern, position and orientation of the micro-lens array) 100 allowing for a derivation of a two-plane parameterization describing the field of rays corresponding to the pixels of the sensor. The set of rays in a light field can be parameterized in a variety of ways. Of these, the most common is the two-plane parameterization.

Figure 3A:
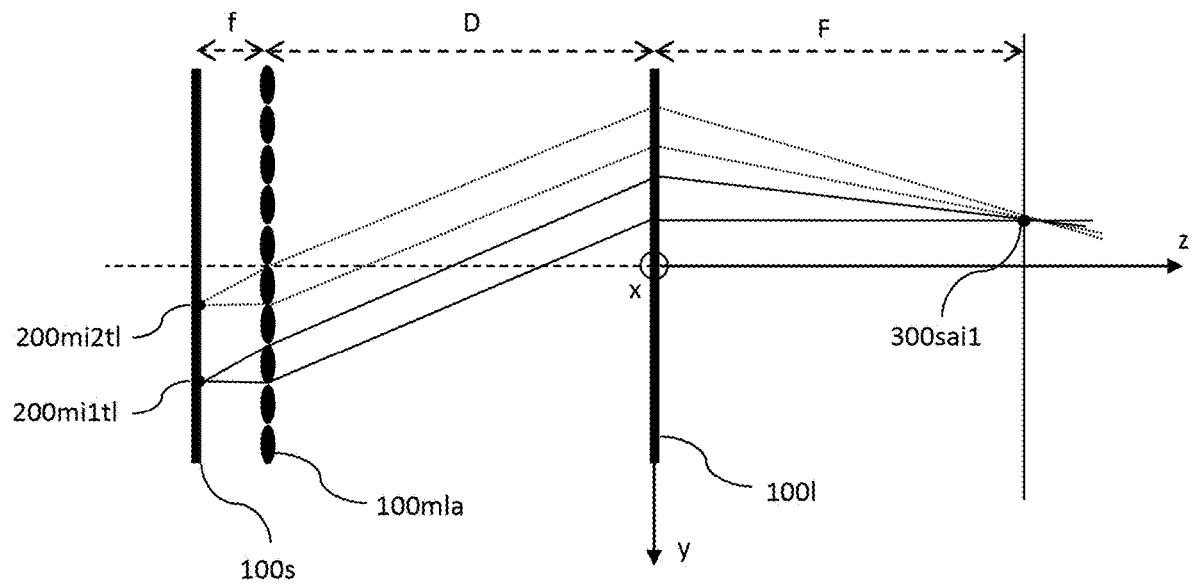
Figure 3B:
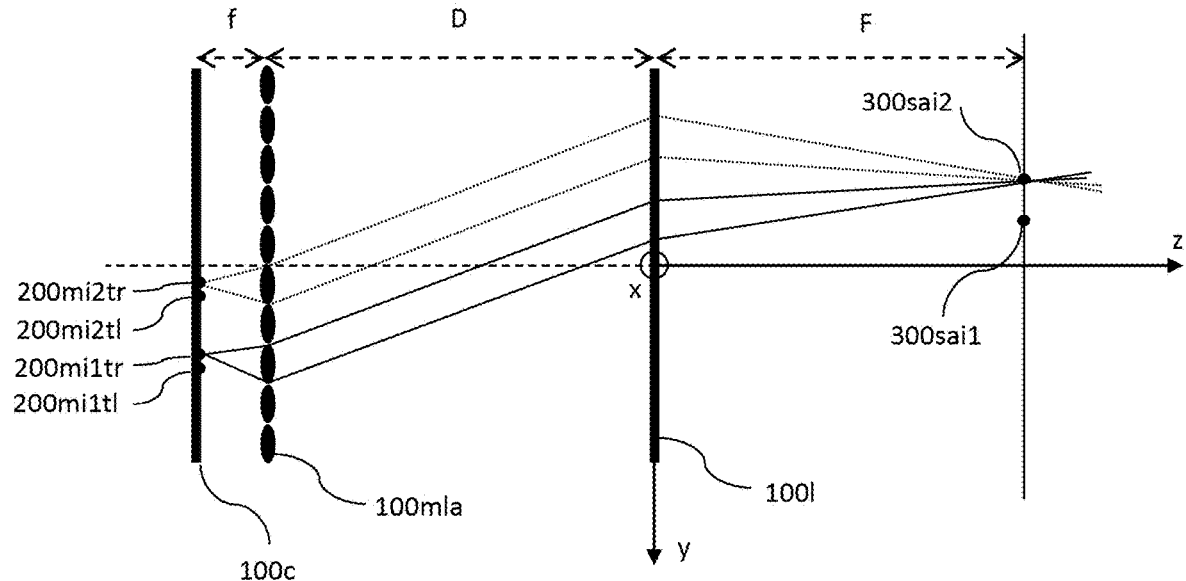

The property of the type I plenoptic camera 100 according to which all the waists of the ray bundles corresponding to the pixels belonging to a same sub-aperture image reach a same point in the object focal plane of the camera 100 is illustrated by FIGS. 3a and 3b.

More particularly, as for any type I plenoptic camera, the sensor 100s is located in the image focal plane (i.e. in the plane of equation z=−D−f in the CS) of the micro-lens array 100mla (i.e. each pixel of the sensor is at a distance f of the micro-lens array 100mla). Consequently, a ray bundle originating from a given pixel on the sensor and encompassing a given micro-lens of the micro-lens array 100mla results in parallel rays in between the considered given micro-lens and the main lens 100l. The parallel rays are further collimated by the main lens 100l so that they all converge toward a given focal point in the object focal plane of the main lens 100l (i.e. in the plane of equation z=F in the CS).

For instance, as illustrated in FIG. 3a, the ray bundle corresponding to the top left pixel 200mi1tl of sub-aperture image 200sai1 (that thus corresponds to the top left pixel 200mi1tl of the micro-image 200mi1 as discussed above in relation with FIGS. 2a and 2b) converges toward a single point 300sai1 (thus corresponding to the waist of the ray bundle) in the object focal plane of the main lens 100l.

Furthermore, due to this particular disposition of the optical system of type I plenoptic camera, it happens that all the ray bundles corresponding to the pixels of the same sub-aperture image all converge toward the same single point in the object focal plane of the main lens 100l. In other words, all the ray bundles corresponding to the pixels of the same sub-aperture image share a common waist that is located in the object focal plane of the main lens 100l.

For instance, the ray bundle corresponding to the top center pixel 200mi2tl of sub-aperture image 200sai1 (that thus corresponds to the top left pixel 200mi2tl of the micro-image 200mi2 as discussed above in relation with FIGS. 2a and 2b) also converges toward the point 300sai1 as do the ray bundle corresponding to the top left pixel 200mi1tl. The point 300sai1 in the object focal plane of the main lens 100l is thus the common waist of the ray bundles corresponding to the pixels belonging to the sub-aperture image 200sai1.

The same holds for the pixels of any sub-aperture image of the matrix 200sai. For instance, the ray bundle corresponding to the top center pixel 200mi2tr of sub-aperture image 200sai2 (that thus corresponds to the top right pixel 200mi2tr of the micro-image 200mi2 as discussed above in relation with FIGS. 2a and 2b) also converges toward the point 300sai2 as do the ray bundle corresponding to the top left pixel 200mi1tr of sub-aperture image 200sai2 as illustrated in FIG. 3b. The point 300sai2 in the object focal plane of the main lens 100l is thus the common waist of the ray bundles corresponding to the pixels belonging to the sub-aperture image 200sai2.

Consequently, a common waist of the ray bundles corresponding to the pixels belonging to the same sub-aperture image can be uniquely defined for each sub-aperture image of the matrix 200sai of sub-aperture images.

Figure 4:
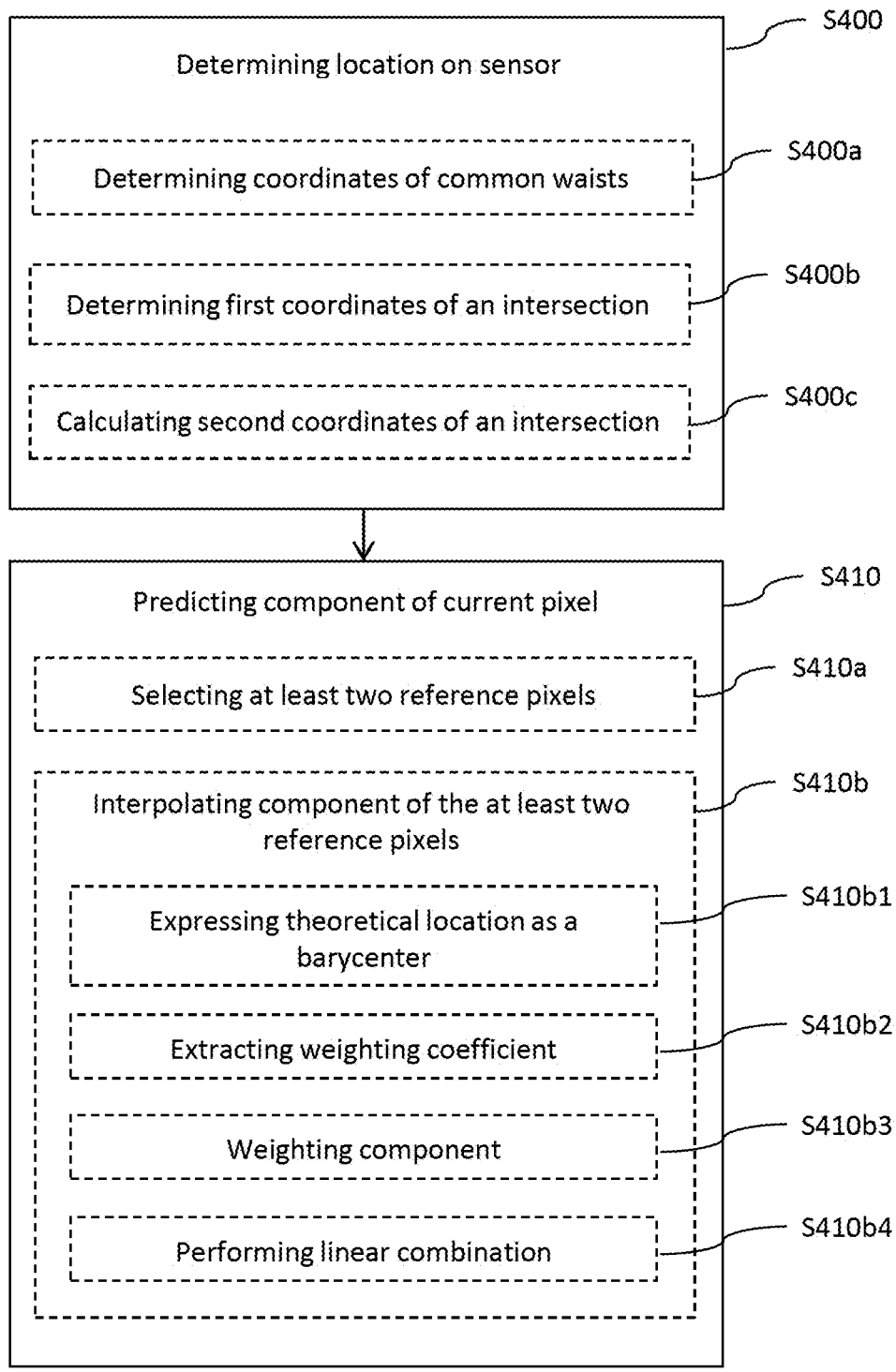

FIG. 4 illustrates a method for predicting a component of a current pixel according to at least one embodiment. Such method can be implemented for instance in the encoder 120 and/or in the decoder 130. The corresponding steps are detailed through an example discussed in reference to FIGS. 5a and 5b.

As an example, let consider that the considered current pixel is the pixel 200mi2tr belonging to the current sub-aperture image that is assumed to be the sub-aperture image 200sai2.

In a step S400, a location 500 is determined on the sensor 100s based on the following parameters of the camera 100:
the distance D from the exit pupil of the main lens 100l of the camera 100 to the micro-lens array 100mla of the camera 100;
the focal length F of the main lens 100l;
the focal length f of the micro-lenses of the micro-lens array 100mla; and
a set of parameters (e.g. pattern, position and orientation of the micro-lens array) of a model of the camera 100 allowing for a derivation of a two-plane parameterization describing the field of rays corresponding to the pixels of the sensor 100s.

More particularly, the location 500 is expected to be close to one or more reference pixel(s) on the sensor 100s that belong(s) to a reference sub-aperture image, assumed to be the sub-aperture image 200sai1 in the present example, and that captured a same object point as the current pixel.

For that, the property discussed above in relation with FIGS. 3a and 3b according to which a common waist of the ray bundles corresponding to the pixels belonging to the same sub-aperture image can be uniquely defined for each sub-aperture image of the matrix 200sai of sub-aperture images is used.

Figure 5A:
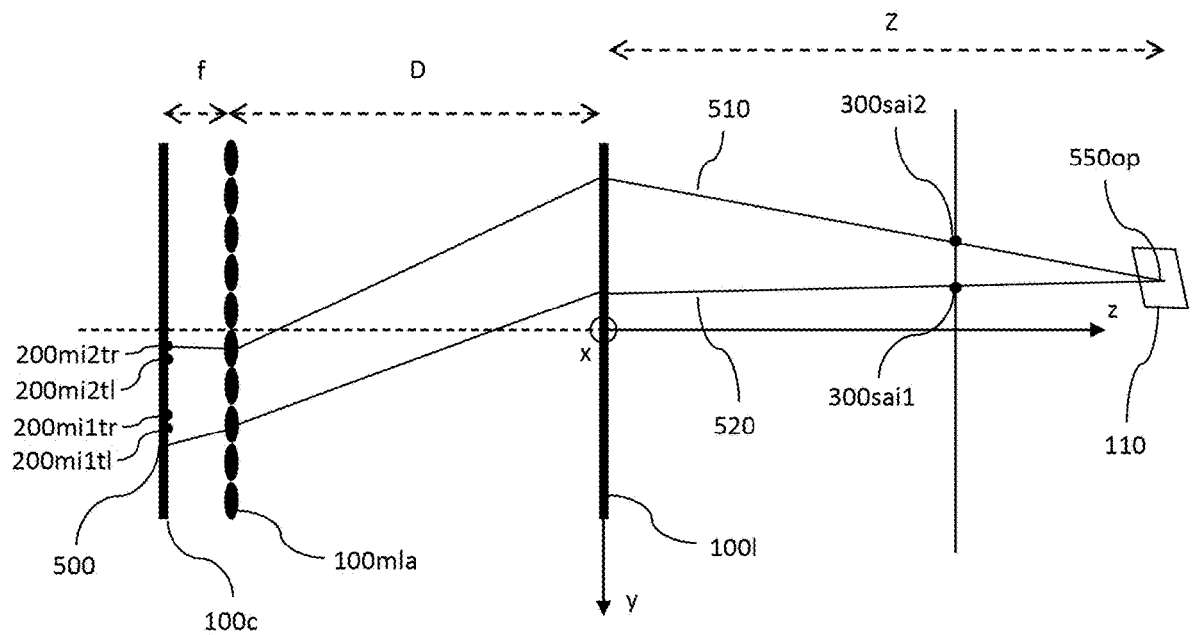
FIG. 5b illustrates a location determined on the sensor of the type I plenoptic camera of FIG. 1 by applying the method of FIG. 4.

More particularly, as illustrated in FIG. 5a, an object point 550op located at depth Z along a first ray 510 corresponding to the current pixel 200mi2tr is determined based on the set of parameters of the model of the camera 100. Here, the depth Z is a depth associated with the considered current pixel 200mi2tr. For instance, the depth Z is determined by treatment of the current sub-aperture image 200sai2 to which the current pixel 200mi2tr belongs. In that case the object point belongs to the object 110 captured by the camera 100. In another variant, the depth Z is captured by a dedicated depth sensor of the camera 100 at the same time than the current sub-aperture image 200sai2 is captured. In yet other variants, the depth Z is provided as a default value.

The location 500 is determined as the intersection with the sensor 100s of a second ray 520 originating from the object point 550op and passing through the common waist 300sai1 of the ray bundles corresponding to the pixels belonging to a reference sub-aperture image 200sai1. Due to this constraint of passing through the common waist 300sai1, it can be expected that the second ray 520 matches an effective ray that reaches a reference pixel belonging to the reference sub-aperture image 200sai1 that captured the same object point 550op than the considered current pixel 200mi2tr. According to that, it can be expected that the location 500 coincide with one reference pixel or at least is close to reference pixel(s) belonging to the reference sub-aperture image 200sai1. It is therefore meaningful to predict one or more component(s) of the current pixel 200mi2tr based on component(s) of the reference pixel(s) belonging to the reference sub-aperture image 200sai1 and located on the sensor 100s in a neighborhood of the location 500.

Back to FIG. 4, for determining the theoretical location 500 the coordinates $$\begin{pmatrix} x_F \\ y_F \end{pmatrix}$$

of the common waist 300*sai*2 of the ray bundles corresponding to the pixels belonging to the current sub-aperture image 200*sai*2 are determined in the object focal plane of the main lens 100*l* in a step S400*a*. Indeed, as discussed above in relation with the FIGS. 3*a* and 3*b*, such common waist 300*sai*2 can be uniquely determined in the object focal plane (i.e. in the plane of equation z=F in the CS) of the camera 100. In the same way, the coordinates $$\begin{pmatrix} x'_F \\ y'_F \end{pmatrix}$$

of the common waist 300*sai*1 of the ray bundles corresponding to the pixels belonging to the reference sub-aperture image 200*sai*1, are determined in the object focal plane of the camera 100.

In the considered embodiment, the two-plane parameterization comprises $I_0[i,j,u,v]$ and $I_1[i,j,u,v]$ defining respectively the intersection with the plane z=0 and z=1, in the CS, of a chief ray corresponding to a pixel of position (u,v) in the sub-aperture image of index (i,j) in the matrix 200*sai* of sub-aperture images.

In that case, the coordinates $$\begin{pmatrix} x_F \\ y_F \end{pmatrix} \text{ and } \begin{pmatrix} x'_F \\ y'_F \end{pmatrix}$$

are respectively determined as:

$$\begin{pmatrix} x_F \\ y_F \end{pmatrix} = I_1[i_c, j_c, u_{ca}, v_{ca}] \cdot F + I_0[i_c, j_c, u_{ca}, v_{ca}] \cdot (1-F) \quad \text{(Eq-1a)}$$

and $$\begin{pmatrix} x'_F \\ y'_F \end{pmatrix} = I_1[i_r, j_r, u_{ra}, v_{ra}] \cdot F + I_0[i_r, j_r, u_{ra}, v_{ra}] \cdot (1-F) \quad \text{(Eq-1b)}$$

with:
F the focal length of the main lens 100*l*;
($i_c,j_c$) the indexes of the current sub-aperture image 200*sai*2 in the matrix 200*sai* of sub-aperture images;
($u_{ca},v_{ca}$) the coordinates of any pixel in the current sub-aperture image 200*sai*2.
($i_r,j_r$) the indexes of the reference sub-aperture image 200*sai*1 in the matrix 200*sai* of sub-aperture images; and
($u_{ra},v_{ra}$) the coordinates of any pixel in the reference sub-aperture image 200*sai*1.

In other embodiments, the two-plane parameterization comprises $I_{z0}[i,j,u,v]$ and $I_{z1}[i,j,u,v]$ defining respectively the intersection of chief rays with other planes than the plane z=0 and z=1, in the CS, e.g. z=$z_0$ and z=$z_1$. In that case, the linear interpolation defined through (Eq-1 a) and (Eq-1b) can be respectively rewritten as:

$$\begin{pmatrix} x_F \\ y_F \end{pmatrix} = I_{z1}[i_c, j_c, u_{ca}, v_{ca}] \cdot \left(\frac{F-z_0}{z_1-z_0}\right) + I_{z0}[i_c, j_c, u_{ca}, v_{ca}] \cdot \left(\frac{z_1-F}{z_1-z_0}\right)$$

and $$\begin{pmatrix} x'_F \\ y'_F \end{pmatrix} = I_{z1}[i_r, j_r, u_{ra}, v_{ca}] \cdot \left(\frac{F-z_0}{z_1-z_0}\right) + I_{z0}[i_r, j_r, u_{ra}, v_{ra}] \cdot \left(\frac{z_1-F}{z_1-z_0}\right)$$

In still other embodiments, the two-plane parameterization defines intersection of other reference rays than chief rays with two different planes.

In a step S400*b*, first coordinates of an intersection, with a given plane, of the first ray 510 corresponding to the current pixel 200*mi*2*tr* are determined.

In the present embodiment the given plane is the plane z=0 in the CS and the first ray 510 is a chief ray corresponding to the current pixel 200*mi*2*tr* on the sensor 100*s*.

$$\begin{pmatrix} x_0 \\ y_0 \end{pmatrix},$$

In that case, the first coordinates, are determined as:

$$\begin{pmatrix} x_0 \\ y_0 \end{pmatrix} = I_0[i_c, j_c, u_c, v_c] \quad \text{(Eq-2)}$$

with:
($i_c,j_c$) the indexes of the current sub-aperture image 200*sai*2 in the matrix 200*sai* of sub-aperture images; and
($u_c,v_c$) the coordinates of the current pixel 200*mi*2*tr* in the current sub-aperture image 200*sai*2.

In other embodiments, the given plane is the plane z=$z_0$ in the CS and (Eq-2) can be rewritten using the parametrization $I_{z0}[i,j,u,v]$ instead of $I_0[i,j,u,v]$.

In still other embodiments, the two-plane parameterization defines intersection of other reference rays than chief rays with two different planes.

In a step S400*c*, second coordinates of an intersection, with the same given plane as used for defining the first coordinates, of the second ray 520 coming from the object point 550*op* located at depth Z along the first ray 510 and passing through the common waist 300*sai*1 of the ray bundles corresponding to the pixels belonging to a reference sub-aperture image 200*sai*1 are calculated.

In the present embodiment where the considered given plane is the plane z=0 in the CS and the first ray 510 is a chief ray corresponding to the current pixel 200*mi*2*tr* on the sensor 100*s*, the coordinates in the CS, $$\begin{pmatrix} x \\ y \\ Z \end{pmatrix},$$

of the object point 550*op* located at depth Z along the first ray 510 can be expressed as a linear interpolation of the coordinates $$\begin{pmatrix} x_0 \\ y_0 \end{pmatrix} \text{ and } \begin{pmatrix} x_F \\ y_F \end{pmatrix}$$

of the two points belonging to the first ray 510 (i.e. of the two points corresponding to the intersection of the first ray 510 with the plane z=0 and z=F respectively) as:

$$\begin{pmatrix} x \\ y \\ Z \end{pmatrix} = \left(1 - \frac{Z}{F}\right) \times \begin{pmatrix} x_0 \\ y_0 \\ 0 \end{pmatrix} + \frac{Z}{F} \times \begin{pmatrix} x_F \\ y_F \\ F \end{pmatrix}$$

Equivalently, the coordinates $$\begin{pmatrix} x \\ y \\ z \end{pmatrix}$$

can be expressed as a barycenter of the second coordinates $$\begin{pmatrix} x'_0 \\ y'_0 \end{pmatrix}$$

and of the coordinates $$\begin{pmatrix} x'_F \\ y'_F \end{pmatrix}$$

or the two points belonging to the second ray 520 as:

$$\begin{pmatrix} x \\ y \\ z \end{pmatrix} = \left(1 - \frac{Z}{F}\right) \times \begin{pmatrix} x'_0 \\ y'_0 \\ 0 \end{pmatrix} + \frac{Z}{F} \times \begin{pmatrix} x'_F \\ y'_F \\ F \end{pmatrix}$$

By equating the two previous expressions for the coordinates $$\begin{pmatrix} x \\ y \\ z \end{pmatrix},$$

one can find that the second coordinates $$\begin{pmatrix} x'_0 \\ y'_0 \end{pmatrix}$$

can be determined as:

$$\begin{pmatrix} x'_0 \\ y'_0 \end{pmatrix} = \begin{pmatrix} x_0 \\ y_0 \end{pmatrix} + \frac{z}{F-Z} \times \left( \begin{pmatrix} x_F \\ y_F \end{pmatrix} - \begin{pmatrix} x'_F \\ y'_F \end{pmatrix} \right) \quad \text{(Eq-3)}$$

with:
F the focal length of the main lens 100*l*; and
Z the depth associated to the current pixel 200*mi2tr*.

In other embodiments where the given plane is the plane z=z₀ in the CS and where (Eq-2) can be rewritten using the parametrization $I_{z0}[i,j,u,v]$ instead of $I_0[i,j,u,v]$, (Eq-3) can be rewritten as:

$$\begin{pmatrix} x'_{z0} \\ y'_{z0} \end{pmatrix} = \begin{pmatrix} x_{z0} \\ y_{z0} \end{pmatrix} + \frac{Z-z_0}{F-Z} \times \left( \begin{pmatrix} x_F \\ y_F \end{pmatrix} - \begin{pmatrix} x'_F \\ y'_F \end{pmatrix} \right)$$

with:

$$\begin{pmatrix} x_{z0} \\ y_{z0} \end{pmatrix}$$

the first coordinates;

$$\begin{pmatrix} x'_{z0} \\ y'_{z0} \end{pmatrix}$$

the second coordinates;
F the focal length of the main lens 100*l*; and
Z the depth associated to the current pixel 200*mi2tr*.

However, selecting the given plane as the plane z=0 in the CS allows more simple derivations and less parameters to share in between the encoder 120 and the decoder 130.

Furthermore, having selected the given plane as the plane z=0 allows deriving the coordinates $$\begin{pmatrix} x_{D+f} \\ y_{D+f} \end{pmatrix},$$

in the plane of sensor z=−D−f, of the location 500 in a straightforward manner based on the coordinates $$\begin{pmatrix} x'_F \\ y'_F \end{pmatrix}$$

of the common waist 300*sai*1 of the ray bundles corresponding to the pixels belonging to the reference sub-aperture image 200*sai*1 and on the second coordinates $$\begin{pmatrix} x'_0 \\ y'_0 \end{pmatrix}.$$

Indeed, assuming that the deviation of the second ray 520 by the main lens 110*l* and by the micro-lenses of the array 100*mla* remain weak (assumption that is exact when the second ray 520 directly goes through the center of the considered lens or micro-lens), one can write that:

$$\begin{pmatrix} x_{D+f} \\ y_{D+f} \end{pmatrix} = \begin{pmatrix} x'_0 - \tan\theta_x \times (D+f) \\ y'_0 - \tan\theta_y \times (D+f) \end{pmatrix}$$

with $\theta_x$ the angle between the projection of the second ray 520 in the plane (x,z) of the CS and the z axis, and $\theta_y$ the angle between the projection of the second ray 520 in the plane (y,z) of the CS and the z axis.

Assuming furthermore that the focal length F of the main lens 100*l* is much greater than any component of the coordinates $$\begin{pmatrix} x'_F \\ y'_F \end{pmatrix},$$

the tangent functions can be approximated as:

$$\begin{cases} \tan\theta_x = -\dfrac{x'_F}{F} \\ \tan\theta_y = -\dfrac{y'_F}{F} \end{cases}$$

So that finally:

$$\begin{pmatrix} x_{D+f} \\ y_{D+f} \end{pmatrix} = \begin{pmatrix} x'_0 - \dfrac{D+f}{F} x'_F \\ y'_0 - \dfrac{D+f}{F} y'_F \end{pmatrix}$$

Having determined the coordinates of the location 500 on the sensor 100s, in a step S410 at least one component of the current pixel 200mi2tr is predicted based on component(s) of one or more reference pixel(s) belonging to the reference sub-aperture image 200sai1 and located on the sensor 100s in a neighborhood of the location 500.

For that, in a step S410a, at least two reference pixels belonging to the reference sub-aperture image 200sai1 in the matrix 200sai and located on the sensor 100s in the neighborhood of the location 500 are selected (e.g. based on an Euclidian metric, etc.).

In a step S410b, a component of said at least two reference pixels is interpolated (e.g. a linear or bilinear interpolation, a bicubic interpolation, a Lanczos interpolation, etc.) for delivering an interpolated component. In that case, the predicted component of the current pixel 200mi2tr is a function of the interpolated component (e.g. proportional to, etc.).

However, in other embodiments not illustrated, a single reference pixel belonging to the reference sub-aperture image 200sai1 and located on the sensor 100s in the neighborhood of the location 500 is selected. In that case, the predicted component of the current pixel 200mi2tr is directly derived from a component of the selected reference pixel (e.g. the value of the component of the selected reference pixel is assigned to the current pixel 200mi2tr as the predicted component).

Back to FIG. 4, in a step S410b1, the coordinates $$\begin{pmatrix} x_{D+f} \\ y_{D+f} \end{pmatrix}$$

of the location 500 are expressed as a barycenter of the coordinates of said at least two reference pixels. For each considered reference pixel among said at least two reference pixels:

in a step S410b2, the coefficient weighting the coordinates of the considered reference pixel in the barycenter expression are extracted; and in a step S410b3, a component of the considered reference pixel is weighted with the corresponding extracted coefficient.

Then, in a step S410b4, the linear combination of the weighted components is performed for delivering the interpolated component.

Figure 5B:
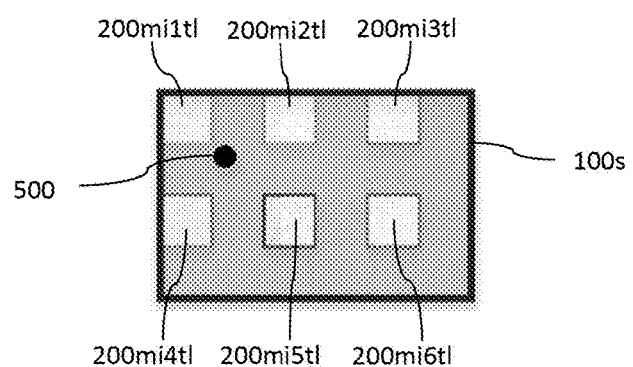

For instance, let consider as an illustrative example that the four reference pixels selected in the close neighborhood of the location 500 are pixels 200mi1tl, 200mi2tl, 200mi4tl and 200mi5tl (FIG. 5b). In that case, the coordinates $$\begin{pmatrix} x_{D+f} \\ y_{D+f} \end{pmatrix}$$

or the location 500 can be expressed as the barycenter expression:

$$\begin{pmatrix} x_{D+f} \\ y_{D+f} \end{pmatrix} = \alpha\beta\begin{pmatrix} x_l \\ y_t \end{pmatrix} + (1-\alpha)\beta\begin{pmatrix} x_r \\ y_t \end{pmatrix} + (1-\alpha)(1-\beta)\begin{pmatrix} x_r \\ y_b \end{pmatrix} + \alpha(1-\beta)\begin{pmatrix} x_l \\ y_b \end{pmatrix}$$

with:

$$\alpha = \frac{x - x_r}{x_l - x_r}; \text{ and}$$

$$\beta = \frac{y - y_b}{y_t - y_b};$$

and where, in the CS:

$x_t$ stands for the common abscise of reference pixels 200mi1tl and 200mi4tl;

$x_r$ stands for the common abscise of reference pixels 200mi2tl and 200mi5tl;

$y_t$ stands for the common ordinate of reference pixels 200mi1tl and 200mi2tl; and $y_b$ stands for the common ordinate of reference pixels 200mi4tl and 200mi5tl.

Application of steps S410b2, S410b3 and S410b4 to the above barycenter expression leads to the following expression for the predicted component $\hat{Y}$ of the current pixel 200mi2tr:

$$\hat{Y} = \alpha\beta Y_{tl} + (1-\alpha)\beta Y_{tr} + (1-\alpha)(1-\beta) Y_{br} + \alpha(1-\beta) Y_{bl}$$

with:

$Y_{tl}$ the component of the reference pixel 200mi1tl;

$Y_{tr}$ the component of the reference pixel 200mi2tl;

$Y_{bl}$ the component of the reference pixel 200mi4tl; and $Y_{br}$ the component of the reference pixel 200mi5tl.

The prediction method can thus be part of an encoding method and/or of a decoding method. To this aim, on the encoder side, a residue between the component Y and the predicted component $\hat{Y}$ of the current pixel is then encoded in the bitstream.

On the decoder side, a residue is decoded from the bitstream and a component Y is reconstructed by adding the predicted component $\hat{Y}$ of the current pixel to the decoded residue.

Figure 6:
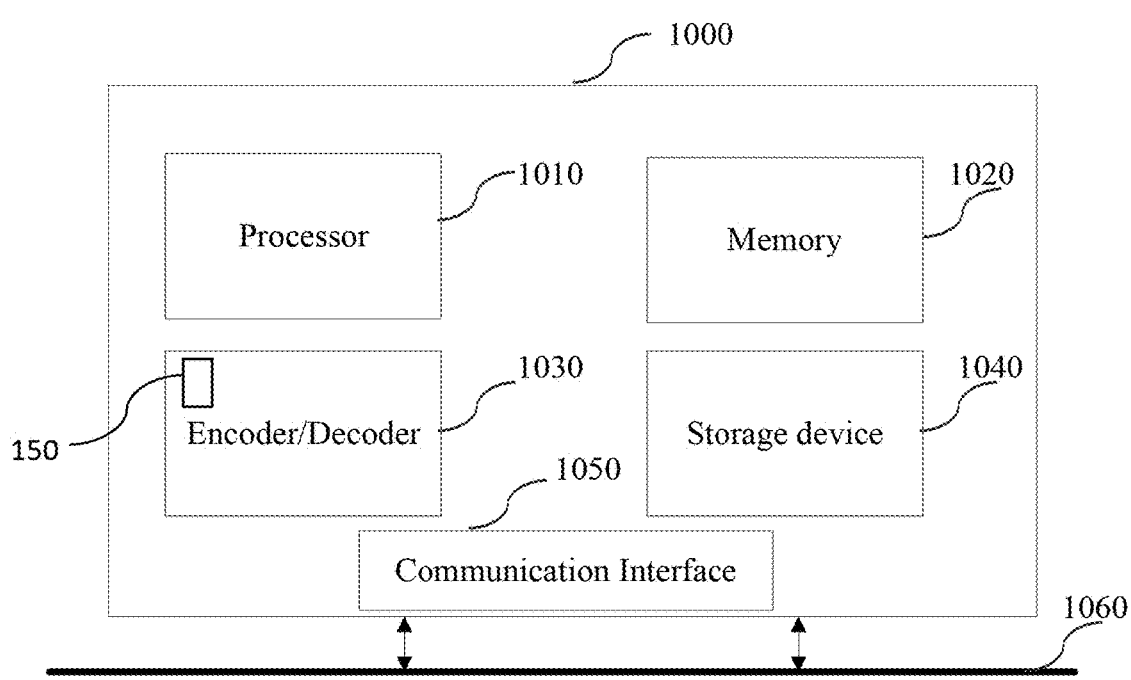
FIG. 6 illustrates an exemplary system that can be used for implementing the method of FIG. 4.

FIG. 6 illustrates a block diagram of an exemplary system in which various aspects and exemplary embodiments are implemented. System 1000 is a particular way of implementing the encoder 120 and/or the decoder 130 and can be embodied as a device including the various components described below and is configured to perform one or more of the aspects described in this document. Examples of such devices, include, but are not limited to, personal computers, laptop computers, smartphones, tablet computers, digital multimedia set top boxes, digital television receivers, personal video recording systems, connected home appliances, and servers. System 1000 can be communicatively coupled to other similar systems, and to a display via a communication channel as shown in FIG. 6 and as known by those skilled in the art to implement the various aspects described in this document.

The system 1000 can include at least one processor 1010 configured to execute instructions loaded therein for implementing the various aspects described in this document. Processor 1010 can include embedded memory, input output interface, and various other circuitries as known in the art. The system 1000 can include at least one memory 1020 (e.g., a volatile memory device, a non-volatile memory device). System 1000 can include a storage device 1040, which can include non-volatile memory, including, but not limited to, EEPROM, ROM, PROM, RAM, DRAM, SRAM, flash, magnetic disk drive, and/or optical disk drive. The storage device 1040 can include an internal storage device, an attached storage device, and/or a network accessible storage device, as non-limiting examples. System 1000 can include an encoder/decoder module 1030 configured to process data to provide an encoded video or decoded video, and the encoder/decoder module 1030 can include its own processor and memory. The encoder/decoder module 1030 is configured to implement the prediction method according to at least one embodiment and thus includes a device 150 configured for predicting a component of a current pixel according to the method illustrated on FIG. 4 (according to any of its embodiments). Such device 150 can include its own processor and memory.

Encoder/decoder module 1030 represents the module(s) that can be included in a device to perform the encoding and/or decoding functions. As is known, a device can include one or both of the encoding and decoding modules. Additionally, encoder/decoder module 1030 can be implemented as a separate element of system 1000 or can be incorporated within processors 1010 as a combination of hardware and software as known to those skilled in the art.

Program code to be loaded onto processors 1010 to perform the various aspects described in this document can be stored in storage device 1040 and subsequently loaded onto memory 1020 for execution by processors 1010. In accordance with the exemplary embodiments, one or more of the processor(s) 1010, memory 1020, storage device 1040, and encoder/decoder module 1030 can store one or more of the various items during the performance of the processes described in this document, including, but not limited to the input video, the decoded video, the bitstream, equations, formulas, matrices, variables, operations, and operational logic.

The system 1000 can include communication interface 1050 that enables communication with other devices via communication channel 1060. The communication interface 1050 can include, but is not limited to, a transceiver configured to transmit and receive data from communication channel 1060. The communication interface 1050 can include, but is not limited to, a modem or network card and the communication channel can be implemented within a wired and/or a wireless medium. The various components of system 1000 can all be connected or communicatively coupled together using various suitable connections, including, but not limited to internal buses, wires, and printed circuit boards.

The exemplary embodiments can be carried out by computer software implemented by the processor 1010 or by hardware, or by a combination of hardware and software. As a non-limiting example, the exemplary embodiments can be implemented by one or more integrated circuits. The memory 1020 can be of any type appropriate to the technical environment and can be implemented using any appropriate data storage technology, such as optical memory devices, magnetic memory devices, semiconductor-based memory devices, fixed memory, and removable memory, as non-limiting examples. The processor 1010 can be of any type appropriate to the technical environment, and can encompass one or more of microprocessors, general purpose computers, special purpose computers, and processors based on a multi-core architecture, as non-limiting examples.

The implementations and aspects described herein can be implemented in, for example, a method or a process, an apparatus, a software program, a data stream, or a signal. Even if only discussed in the context of a single form of implementation (for example, discussed only as a method), the implementation of features discussed can also be implemented in other forms (for example, an apparatus or program). An apparatus can be implemented in, for example, appropriate hardware, software, and firmware. The methods can be implemented in, for example, an apparatus such as, for example, a processor, which refers to processing devices in general, including, for example, a computer, a microprocessor, an integrated circuit, or a programmable logic device. Processors also include communication devices, such as, for example, computers, cell phones, portable/personal digital assistants ("PDAs"), and other devices that facilitate communication of information between end-users.

Reference to "one embodiment" or "an embodiment" or "one implementation" or "an implementation", as well as other variations thereof, mean that a particular feature, structure, characteristic, and so forth described in connection with the embodiment is included in at least one embodiment. Thus, the appearances of the phrase "in one embodiment" or "in an embodiment" or "in one implementation" or "in an implementation", as well any other variations, appearing in various places throughout this document are not necessarily all referring to the same embodiment.

Additionally, this document may refer to "determining" various pieces of information. Determining the information can include one or more of, for example, estimating the information, calculating the information, predicting the information, or retrieving the information from memory.

Further, this document may refer to "accessing" various pieces of information. Accessing the information can include one or more of, for example, receiving the information, retrieving the information (for example, from memory), storing the information, processing the information, transmitting the information, moving the information, copying the information, erasing the information, calculating the information, determining the information, predicting the information, or estimating the information.

Additionally, this document may refer to "receiving" various pieces of information. Receiving is, as with "accessing", intended to be a broad term. Receiving the information can include one or more of, for example, accessing the information, or retrieving the information (for example, from memory). Further, "receiving" is typically involved, in one way or another, during operations such as, for example, storing the information, processing the information, transmitting the information, moving the information, copying the information, erasing the information, calculating the information, determining the information, predicting the information, or estimating the information.

As will be evident to one of ordinary skill in the art, implementations can produce a variety of signals formatted to carry information that can be, for example, stored or transmitted. The information can include, for example, instructions for performing a method, or data produced by one of the described implementations. For example, a signal can be formatted to carry the bitstream of a described embodiment. Such a signal can be formatted, for example, as an electromagnetic wave (for example, using a radio frequency portion of spectrum) or as a baseband signal. The formatting can include, for example, encoding a data stream and modulating a carrier with the encoded data stream. The information that the signal carries can be, for example, analog or digital information. The signal can be transmitted over a variety of different wired or wireless links, as is known. The signal can be stored on a processor-readable medium.

According to one embodiment, a method is proposed for predicting a component of a current pixel belonging to a current sub-aperture image in a matrix of sub-aperture images captured by a sensor of a type I plenoptic camera. Such method comprises:

determining a location on the sensor based at least on:
- a distance D from an exit pupil of a main lens of the camera to a micro-lens array of the camera;
- a focal length F of the main lens;
- a focal length f of the micro-lenses of the micro-lens array; and
- a set of parameters of a model of the camera allowing for a derivation of a two-plane parameterization describing the field of rays corresponding to the pixels of the sensor;

predicting the component of the current pixel based on at least one reference pixel belonging to a reference sub-aperture image in the matrix and located on the sensor in a neighborhood of the location.

Thus, the present disclosure proposes a new and inventive solution for predicting a component (e.g. a chrominance or luminance) of a current pixel of a sub-aperture image in a light field captured by a type I plenoptic camera.

More particularly, this prediction relies among other on a two-plane parameterization that leads to improved prediction results compared to simple pinhole models as assumed for instance in the VSP technic.

Furthermore, having that only parameters of the camera are used, the derivations can be performed e.g. on both the encoding side and the decoding side based on a small number of parameters to be shared in between the devices. Furthermore, the physical parameters of the camera are static parameters so that there is no need for a frequent update thus minimizing further the overhead cost on top of the light field data.

According to one embodiment, a device is proposed for predicting a component of a current pixel belonging to a current sub-aperture image in a matrix of sub-aperture images captured by a sensor of a type I plenoptic camera. Such device comprises a processor configured for:

determining a location on the sensor based at least on:
- a distance D from an exit pupil of a main lens of the camera to a micro-lens array of the camera;
- a focal length F of the main lens;
- a focal length f of the micro-lenses of the micro-lens array; and
- a set of parameters of a model of the camera allowing for a derivation of a two-plane parameterization describing the field of rays corresponding to the pixels of the sensor;

predicting the component of the current pixel based on at least one reference pixel belonging to a reference sub-aperture image in the matrix and located on the sensor in a neighborhood of the location.

According to one embodiment, the location is determined as an intersection with the sensor of a second ray originating from an object point and passing through a common waist of the ray bundles corresponding to the pixels belonging to a reference sub-aperture image in the matrix, the object point being located at depth Z along a first ray corresponding to the current pixel.

According to one embodiment, the determining the location comprises:

determining in the object focal plane of the camera: coordinates $$\begin{pmatrix} x_F \\ y_F \end{pmatrix}$$

or a common waist or the ray bundles corresponding to the pixels belonging to the current sub-aperture image; and
coordinates $$\begin{pmatrix} x'_F \\ y'_F \end{pmatrix}$$

of the common waist of the ray bundles corresponding to the pixels belonging to the reference sub-aperture image;

determining first coordinates of an intersection, with a given plane, of the first ray corresponding to the current pixel on the sensor; and calculating second coordinates of an intersection, with the given plane, of the second ray corresponding to the location on the sensor and coming from the object point located at depth Z along the first ray, based at least on the first coordinates, on the coordinates $$\begin{pmatrix} x_F \\ y_F \end{pmatrix}$$

and on the coordinates $$\begin{pmatrix} x'_F \\ y'_F \end{pmatrix};$$

and wherein coordinates of the location, $$\begin{pmatrix} x_{D+f} \\ y_{D+f} \end{pmatrix},$$

in the plane of the sensor are a function at least of the second coordinates and of the coordinates $$\begin{pmatrix} x'_F \\ y'_F \end{pmatrix}.$$

Thus, the property of type I plenoptic cameras according to which the ray bundles corresponding to the pixels belonging to the same sub-aperture image have a common waist in the object focal plane (i.e. the plane corresponding to z=F in the coordinate system of the camera) allows straightforward derivations based on optical geometry considerations.

According to one embodiment, the two-plane parameterization comprises $I_0[i,j,u,v]$ and $I_1[i,j,u,v]$ defining respectively the intersection with the plane z=0 and z=1, in the coordinate system of the camera, of a chief ray corresponding to a pixel of position (u,v) in the sub-aperture image of index (i,j) in the matrix of sub-aperture images. The object focal plane is the plane z=F in the coordinate system of the camera. The determining the coordinates $$\begin{pmatrix} x_F \\ y_F \end{pmatrix} \text{ and } \begin{pmatrix} x'_F \\ y'_F \end{pmatrix}$$

enforces respectively the relationships:

$$\begin{pmatrix} x_F \\ y_F \end{pmatrix} = I_1[i_c, j_c, u_{ca}, v_{ca}].F + I_0[i_c, j_c, u_{ca}, v_{ca}].(1-F), \text{ and}$$

$$\begin{pmatrix} x'_F \\ y'_F \end{pmatrix} = I_1[i_r, j_r, u_{ra}, v_{ra}].F + I_0[i_r, j_r, u_{ra}, v_{ra}].(1-F),$$

with:
F the focal length;
($i_c,j_c$) the indexes of the current sub-aperture image in the matrix of sub-aperture images;
($u_{ca},v_{ca}$) the coordinates of any pixel in the current sub-aperture image.
($i_r,j_r$) the indexes of the reference sub-aperture image in the matrix of sub-aperture images; and
($u_{ra},v_{ra}$) the coordinates of any pixel in the reference sub-aperture image.

In other words, the coordinates $$\begin{pmatrix} x_F \\ y_F \end{pmatrix}$$

are independent of the coordinates ($u_{ca}$, $v_{ca}$) of the considered pixel in the current sub-aperture image. The same holds for the coordinates $$\begin{pmatrix} x'_F \\ y'_F \end{pmatrix}$$

following the above-mentioned property of type I plenoptic cameras according to which the ray bundles corresponding to the pixels belonging to the same sub-aperture image have a common waist in the object focal plane.

According to one embodiment, the given plane is the plane z=0 in the coordinate system of the camera. The determining first coordinates enforces the relationship $$\begin{pmatrix} x_0 \\ y_0 \end{pmatrix} = I_0[i_c, j_c, u_c, v_c],$$

with:

$$\begin{pmatrix} x_0 \\ y_0 \end{pmatrix}$$

the first coordinates;
($i_c,j_c$) the indexes of the current sub-aperture image in the matrix of sub-aperture images; and
($u_c,v_c$) the coordinates of the current pixel in the current sub-aperture image.

According to one embodiment, the calculating second coordinates enforces the equation $$\begin{pmatrix} x'_0 \\ y'_0 \end{pmatrix} = \begin{pmatrix} x_0 \\ y_0 \end{pmatrix} + \frac{Z}{F-Z} \times \left( \begin{pmatrix} x_F \\ y_F \end{pmatrix} - \begin{pmatrix} x'_F \\ y'_F \end{pmatrix} \right),$$

with:

$$\begin{pmatrix} x'_0 \\ y'_0 \end{pmatrix}$$

the second coordinates;
F the focal length; and
Z the depth.

According to one embodiment, the plane of the sensor is the plane z=−D-f in the coordinate system of the camera, and wherein the determining the location enforces the equation $$\begin{pmatrix} x_{D+f} \\ y_{D+f} \end{pmatrix} = \begin{pmatrix} x'_0 - \dfrac{D+f}{F} x'_F \\ y'_0 - \dfrac{D+f}{F} y'_F \end{pmatrix},$$

with:

$$\begin{pmatrix} x_{D+f} \\ y_{D+f} \end{pmatrix}$$

the coordinates of the location in the plane of the sensor;
F the focal length;
f the focal length of the micro-lenses of the micro-lens array; and
D the distance from the exit pupil of the main lens of the camera to the micro-lens array of the camera.

According to one embodiment, the predicting the component of the current pixel comprises:
selecting at least two reference pixels belonging to the reference sub-aperture image in the matrix and located on the sensor in the neighborhood of the location; and
interpolating a component of each of the at least two reference pixels delivering an interpolated component.

The predicted component of the current pixel is a function of the interpolated component (e.g. a linear or bilinear interpolation, a bicubic interpolation, a Lanczos interpolation, etc.)

According to one embodiment, the interpolating comprises:
expressing the location as a barycenter of the coordinates of the at least two reference pixels on the sensor; and
for each considered reference pixel among the at least two reference pixels:
extracting the coefficient weighting the coordinates of the considered reference pixel in the barycenter expression;
weighting a component of the considered reference pixel with the corresponding extracted coefficient; and
performing the linear combination of the weighted components delivering the interpolated component.

Thus, the interpolation is simple and robust.

According to one embodiment, a bitstream carrying a light field captured by a sensor of a type I plenoptic camera is proposed. Such bitstream comprises metadata comprising:

a distance D from an exit pupil of a main lens of the camera to a micro-lens array of the camera;
a focal length F of the main lens;
a focal length f of the micro-lenses of the micro-lens array; and
a set of parameters of a model of the camera allowing for a derivation of a two-plane parameterization describing the field of rays corresponding to the pixels of the sensor.

According to one embodiment, a non-transitory computer readable medium comprising a computer program product recorded thereon and capable of being run by a processor, including program code instructions comprising program code instructions for implementing a method for predicting a component of a current pixel belonging to a current sub-aperture image in a matrix of sub-aperture images captured by a sensor of a type I plenoptic camera previously described is proposed.

According to one embodiment, an encoding method is proposed comprising the method for predicting a component of a current pixel belonging to a current sub-aperture image in a matrix of sub-aperture images captured by a sensor of a type I plenoptic camera as disclosed above (in any of its embodiments).

According to one embodiment, a decoding method is proposed comprising the method for predicting a component of a current pixel belonging to a current sub-aperture image in a matrix of sub-aperture images captured by a sensor of a type I plenoptic camera as disclosed above (in any of its embodiments).

According to one embodiment, an encoder is proposed comprising a device for predicting a component of a current pixel belonging to a current sub-aperture image in a matrix of sub-aperture images captured by a sensor of a type I plenoptic camera as disclosed above (in any of its embodiments).

According to one embodiment, a decoder is proposed comprising a device for predicting a component of a current pixel belonging to a current sub-aperture image in a matrix of sub-aperture images captured by a sensor of a type I plenoptic camera as disclosed above (in any of its embodiments).

The invention claimed is:

1. A method for predicting, as part of an encoding or a decoding method, a component of a current pixel, the method comprising:
    selecting a first ray corresponding to the current pixel from a two-plane parameterization describing the field of rays corresponding to the pixels of the sensor, wherein the current pixel belongs to a current sub-aperture image in a matrix of sub-aperture images captured by a sensor of a plenoptic camera, and wherein a distance d from a micro-lens array of the camera to the sensor is equal to the focal length f of the micro-lenses of the micro-lens array;
    determining an object point being located at the depth Z of the first ray;
    determining a second ray originating from the object point and passing through a single point corresponding to the waist of the bundle of rays corresponding to pixels belonging to a reference sub-aperture image; and
    determining a location $$\begin{pmatrix} x_{D+f} \\ y_{D+f} \end{pmatrix}$$

on the sensor of the intersection of the second ray with the sensor.

2. The method of claim 1, wherein the determining the location comprises:
    determining in the object focal plane of the camera:
        coordinates $$\begin{pmatrix} x_F \\ y_F \end{pmatrix}$$

of a point corresponding to the waist of the bundle of rays corresponding to the pixels belonging to the current sub-aperture image; and
        coordinates $$\begin{pmatrix} x'_F \\ y'_F \end{pmatrix}$$

of the point of the ray bundles corresponding to the pixels belonging to the reference sub-aperture image;
    determining first coordinates of an intersection, with a given plane, of the first ray corresponding to the current pixel on the sensor; and
    calculating second coordinates of an intersection, with the given plane, of the second ray corresponding to the location on the sensor and coming from the object point located at depth Z along the first ray, based at least on the first coordinates, on the coordinates $$\begin{pmatrix} x_F \\ y_F \end{pmatrix}$$

and on the coordinates $$\begin{pmatrix} x'_F \\ y'_F \end{pmatrix};$$

wherein coordinates of the location, $$\begin{pmatrix} x_{D+f} \\ y_{D+f} \end{pmatrix},$$

in the plane of the sensor are a function at least of the second coordinates and of the coordinates $$\begin{pmatrix} x'_F \\ y'_F \end{pmatrix}.$$

3. The method of claim 1, wherein the two-plane parameterization comprises $I_0[i,j,u,v]$ and $I_1[i,j,u,v]$ defining respectively the intersection with the plane z=0 and z=1, in the coordinate system of the camera, of a chief ray corresponding to a pixel of position (u,v) in the sub-aperture image of index (i,j) in the matrix of sub-aperture images, wherein the object focal plane is the plane z=F in the coordinate system of the camera, and wherein the determining the coordinates $$\begin{pmatrix} x_F \\ y_F \end{pmatrix}$$

and $$\begin{pmatrix} x'_F \\ y'_F \end{pmatrix}$$

enforces respectively the relationships:

$$\begin{pmatrix} x_F \\ y_F \end{pmatrix} = I_1[i_c, j_c, u_{ca}, v_{ca}] \cdot F + I_0[i_c, j_c, u_{ca}, v_{ca}] \cdot (1 - F), \text{ and}$$

$$\begin{pmatrix} x'_F \\ y'_F \end{pmatrix} = I_1[i_r, j_r, u_{ra}, v_{ra}] \cdot F + I_0[i_r, j_r, u_{ra}, v_{ra}] \cdot (1 - F),$$

where:
F is the focal length of the main lens;
$(i_c, j_c)$ are the indexes of the current sub-aperture image in the matrix of sub-aperture images;
$(u_{ca}, v_{ca})$ are the coordinates of any pixel in the current sub-aperture image;
$(i_r, j_r)$ are the indexes of the reference sub-aperture image in the matrix of sub-aperture images; and
$(u_{ra}, v_{ra})$ are the coordinates of any pixel in the reference sub-aperture image.

4. The method of claim 3, wherein the given plane is the plane z=0 in the coordinate system of the camera, and wherein the determining first coordinates enforces the relationship:

$$\begin{pmatrix} x_o \\ y_o \end{pmatrix} = I_0[i_c, j_c, u_c, v_c],$$

where:

$$\begin{pmatrix} x_0 \\ y_0 \end{pmatrix}$$

are the first coordinates;
$(i_c, j_c)$ are the indexes of the current sub-aperture image in the matrix of sub-aperture images; and
$(u_c, v_c)$ are the coordinates of the current pixel in the current sub-aperture image.

5. The method of claim 4, wherein the calculating second coordinates enforces the equation:

$$\begin{pmatrix} x'_0 \\ y'_0 \end{pmatrix} = \begin{pmatrix} x_0 \\ y_0 \end{pmatrix} + \frac{Z}{F-Z} \times \left( \begin{pmatrix} x_F \\ y_F \end{pmatrix} - \begin{pmatrix} x'_F \\ y'_F \end{pmatrix} \right);$$

where:

$$\begin{pmatrix} x'_0 \\ y'_0 \end{pmatrix}$$

are the second coordinates;
F is the focal length of the main lens; and
Z is the depth.

6. The method of claim 5, wherein the plane of the sensor is the plane z=D−f in the coordinate system of the camera, and wherein the determining the location enforces the equation:

$$\begin{pmatrix} x_{D+f} \\ y_{D+f} \end{pmatrix} = \begin{pmatrix} x'_0 - \frac{D+f}{F} x'_F \\ y'_0 - \frac{D+f}{F} y'_F \end{pmatrix},$$

where:

$$\begin{pmatrix} x_{D+f} \\ y_{D+f} \end{pmatrix}$$

are the coordinates of the location in the plane of the sensor;
F is the focal length of the main lens;
f is the focal length of the micro-lenses of the micro-lens array; and
D is the distance from the exit pupil of the main lens of the camera to the micro-lens array of the camera.

7. The method of claim 1, wherein the predicting the component of the current pixel comprises:
selecting at least two reference pixels belonging to the reference sub-aperture image in the matrix and located on the sensor in the neighborhood of the location; and
interpolating a component of each of the at least two reference pixels delivering an interpolated component, the predicted component of the current pixel being a function of the interpolated component.

8. The method of claim 7, wherein the interpolating comprises:
expressing the location as a barycenter of the coordinates of the at least two reference pixels on the sensor; and
for each considered reference pixel among the at least two reference pixels:
extracting the coefficient weighting the coordinates of the considered reference pixel in the barycenter expression;
weighting a component of the considered reference pixel with the corresponding extracted coefficient; and
performing the linear combination of the weighted components delivering the interpolated component.

9. An encoding method comprising the predicting method of claim 1.

10. A decoding method comprising the predicting method of claim 1.

11. Non-transitory computer-readable storage medium comprising program code instructions for implementing the method of claim 1, when the program is executed on a computer or a processor.

12. A device for predicting, as part of an encoding or a decoding device, a component of a current, wherein the device comprises a processor configured for:
selecting a first ray corresponding to the current pixel from a two-plane parameterization describing the field of rays corresponding to the pixels of the sensor, wherein the current pixel belongs to a current sub-aperture image in a matrix of sub-aperture images captured by a sensor of a plenoptic camera, and wherein a distance d from a micro-lens array of the camera to the sensor is equal to the focal length f of the micro-lenses of the micro-lens array, determining an object point being located at the depth Z of the first ray, determining a second ray originating from the object point and passing through a single point corresponding to the waist of the bundle of rays corresponding to pixels belonging to a reference sub-aperture image, determining a location $$\begin{pmatrix} x_{D+f} \\ y_{D+f} \end{pmatrix}$$

on the sensor of the intersection of the second ray with the sensor; and predicting the component of the current pixel based on at least one reference pixel belonging to the reference sub-aperture image in the matrix and located on the sensor in a neighborhood of the location.

13. The device of claim 12, wherein the determining the location comprises:

determining in the object focal plane of the camera:
coordinates $$\begin{pmatrix} x_F \\ y_F \end{pmatrix}$$

of a point corresponding to the waist of the bundle of rays corresponding to the pixels belonging to the current sub-aperture image; and
coordinates $$\begin{pmatrix} x'_F \\ y'_F \end{pmatrix}$$

of the point of the ray bundles corresponding to the pixels belonging to the reference sub-aperture image;

determining first coordinates of an intersection, with a given plane, of the first ray corresponding to the current pixel on the sensor; and calculating (S400c) second coordinates of an intersection, with the given plane, of the second ray corresponding to the location on the sensor and coming from the object point located at depth Z along the first ray, based at least on the first coordinates, on the coordinates $$\begin{pmatrix} x_F \\ y_F \end{pmatrix}$$

and on the coordinates $$\begin{pmatrix} x'_F \\ y'_F \end{pmatrix};$$

wherein coordinates of the location, $$\begin{pmatrix} x_{D+f} \\ y_{D+f} \end{pmatrix},$$

in the plane of the sensor are a function at least of the second coordinates and of the coordinates $$\begin{pmatrix} x'_F \\ y'_F \end{pmatrix}.$$

14. The device of claim 12, wherein the two-plane parameterization comprises $I_0[i,j,u,v]$ and $I_1[i,j,u,v]$ defining respectively the intersection with the plane z=0 and z=1, in the coordinate system of the camera, of a chief ray corresponding to a pixel of position (u,v) in the sub-aperture image of index (i,j) in the matrix of sub-aperture images, wherein the object focal plane is the plane z=F in the coordinate system of the camera, and wherein the determining the coordinates $$\begin{pmatrix} x_F \\ y_F \end{pmatrix}$$

and $$\begin{pmatrix} x'_F \\ y'_F \end{pmatrix}$$

enforces respectively the relationships:

$$\begin{pmatrix} x_F \\ y_F \end{pmatrix} = I_1[i_c, j_c, u_{ca}, v_{ca}] \cdot F + I_0[i_c, j_c, u_{ca}, v_{ca}] \cdot (1-F), \text{ and}$$

$$\begin{pmatrix} x'_F \\ y'_F \end{pmatrix} = I_1[i_r, j_r, u_{ra}, v_{ra}] \cdot F + I_0[i_r, j_r, u_{ra}, v_{ra}] \cdot (1-F),$$

with:
F the focal length of the main lens;
$(i_c, j_c)$ the indexes of the current sub-aperture image in the matrix of sub-aperture images;
$(u_{ca}, v_{ca})$ the coordinates of any pixel in the current sub-aperture image;
$(i_r, j_r)$ the indexes of the reference sub-aperture image in the matrix of sub-aperture images; and
$(u_{ra}, v_{ra})$ the coordinates of any pixel in the reference sub-aperture image.

15. The device of claim 12, wherein the predicting the component of the current pixel comprises:

selecting at least two reference pixels belonging to the reference sub-aperture image in the matrix and located on the sensor in the neighborhood of the location; and interpolating a component of each of the at least two reference pixels delivering an interpolated component, the predicted component of the current pixel being a function of the interpolated component.

16. The device of claim 15, wherein the interpolating comprises:

expressing the location as a barycenter of the coordinates of the at least two reference pixels on the sensor; and for each considered reference pixel among the at least two reference pixels:

extracting the coefficient weighting the coordinates of the considered reference pixel in the barycenter expression;

weighting a component of the considered reference pixel with the corresponding extracted coefficient; and performing the linear combination of the weighted components delivering the interpolated component.

17. An encoding device comprising the predicting device of claim 12.

* * * * *